(12) United States Patent
Bailey

(10) Patent No.: US 7,573,415 B1
(45) Date of Patent: Aug. 11, 2009

(54) AREA AND POWER EFFICIENT ANALOG TO DIGITAL CONVERTER AND METHODS FOR USING SUCH

(75) Inventor: James A. Bailey, Snowflake, AZ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 12/024,893

(22) Filed: Feb. 1, 2008

(51) Int. Cl.
H03M 1/12 (2006.01)

(52) U.S. Cl. .................. 341/155; 341/156

(58) Field of Classification Search .......... 375/146; 341/155, 156, 148, 159
See application file for complete search history.

(56) References Cited

U.S. PATENT DOCUMENTS

| | | | |
|---|---|---|---|
| 4,918,450 A * | 4/1990 | Sugiyama et al. | 341/159 |
| 5,173,698 A * | 12/1992 | Gulczynski | 341/158 |
| 5,225,837 A * | 7/1993 | Hosotani et al. | 341/159 |
| 5,809,060 A * | 9/1998 | Cafarella et al. | 375/146 |
| 5,874,911 A | 2/1999 | Kodama | |
| 6,181,269 B1 | 1/2001 | Nishiuchi et al. | |
| 6,232,908 B1 | 5/2001 | Nakaigawa | |
| 6,369,743 B2 * | 4/2002 | Ono | 341/159 |
| 6,404,374 B1 * | 6/2002 | Yu et al. | 341/159 |
| 6,653,966 B1 * | 11/2003 | van der Goes et al. | 341/156 |
| 7,190,298 B2 * | 3/2007 | Mulder | 341/156 |
| 7,209,068 B1 | 4/2007 | Chen et al. | |
| 7,233,277 B2 | 6/2007 | Roh | |
| 7,482,844 B2 * | 1/2009 | Brady et al. | 327/74 |
| 2007/0183006 A1 * | 8/2007 | Lee | 358/513 |

OTHER PUBLICATIONS

Brandt et al., "A 75-mW, 10-b, 10 MSPS CMOS Subranging ADC with 9.5 Effective Bits at Nyquist", IEEE J. Solid State Circuits, vol. 34, No. 12, pp. 1788-1795, Dec. 1999.
Daito et al., "A 14-bit 20-MS/s Pipelined ADC With Digital Distortion Calibration," IEEE J. Solid-State Circuits, vol. 41, No. 11, pp. 2417-2423, Nov. 2006.
Gupta et al., "A 1GS/s 11b Time Interleaved ADC in 0.13um CMOS", ISSCC Dig. Tech. Papers, pp. 576-577, Feb. 2006.
Kim et al., "A 10-b, 10MS/s CMOS A/D Converter", IEEE J. Solid State Circuits, vol. 32, No. 3, pp. 302-311, Mar. 1997.

(Continued)

*Primary Examiner*—Jean B Jeanglaude
(74) *Attorney, Agent, or Firm*—Hamilton, DeSanctis & Cha

(57) ABSTRACT

Various different approaches are provided for conversion of analog signals to digital signals. For example, various analog to digital converter circuits capable of converting an input voltage to a digital representation thereof are discussed. Such analog to digital converter circuits include at least a first comparator and a second comparator. An input of the first comparator is electrically coupled to a first storage device, and another input of the first comparator is electrically coupled to the input voltage. An input of the second comparator is electrically coupled to a second storage device, and another input of the second comparator is electrically coupled to the input voltage. The analog to digital converter circuits further include a reference voltage generation circuit that provides the first reference voltage to the first storage device, and subsequently provides the second reference voltage to the second storage device.

23 Claims, 5 Drawing Sheets

OTHER PUBLICATIONS

Mehr et al., "A 55-mW, 10-bit, 40-Msample/s Nyquist-Rate CMOS ADC," IEEE J. Solid-State Circuits, vol. 35, No. 3, pp. 302-311, Mar. 2000.

Nagaraj et al., "A 250 mW 8-b, 52 Msamples/s Parallel-pipelined A/D Converter with Reduced Number of Amplifiers", IEEE J. Solid State Circuits, vol. 32, pp. 312-320, Mar. 1997.

Singer et al., "A 14-bit 10-MHz calibration-free CMOS pipelined A/D converter," in symp. VLSI Circuits Dig. Tech. Papers, Jun. 1996, pp. 38-39.

U.S. Appl. No. 12/024,909, filed Feb. 1, 2008, Bailey.

* cited by examiner

AREA AND POWER EFFICIENT ANALOG TO DIGITAL CONVERTER AND METHODS FOR USING SUCH

BACKGROUND OF THE INVENTION

The present invention is related to electronic signal conversion, and more particularly to analog to digital converters.

A typical flash analog to digital converter circuit includes a resistor ladder used to generate a number of reference voltages for comparison with an input conversion voltage. Turning to FIG. 1, an exemplary prior art analog to digital converter circuit 100 including a resistor ladder is shown. Analog to digital converter circuit 100 includes a number of comparators 110. A negative input of each of the comparators is fed by the output of a respective multiplexer 120. Each of the multiplexers 120 selects between six different reference voltages generated by the resistor ladder. While three comparators 110, three multiplexers 120 and a resistor ladder including ten resistors are shown, more than these numbers may be included in the circuit as indicated by marks 195, 196.

As shown, the resistor ladder includes a number of resistors 160, 161, 162, 163, 164, 165, 166, 167, 168, 169 that are connected in series between a lower voltage potential 150 and an upper voltage potential 140. Each of the aforementioned resistors generates a distinct reference voltage that may be chosen for comparison by one of comparators 110. In particular, multiplexer 120a receives upper voltage potential 140, a voltage 170 that is one IR drop below upper voltage reference 140, a voltage 171 that is two IR drops below upper voltage reference 140, a voltage 172 that is three IR drops below upper voltage reference 140, a voltage 173 that is four IR drops below upper voltage reference 140, and a voltage 174 that is five IR drops below upper voltage reference 140. Multiplexer 120a is operable to select one of the aforementioned voltages to pass to comparator 110a for comparison with an input conversion voltage 190.

Multiplexer 120b receives voltage 172, voltage 173, voltage 174, a voltage 175 that is six IR drops below upper voltage reference 140, a voltage 176 that is seven IR drops below upper voltage reference 140, and a voltage 177 that is eight IR drops below upper voltage reference 140. Multiplexer 120b is operable to select one of the aforementioned voltages to pass to comparator 110b for comparison with input conversion voltage 190. Multiplexer 120c receives a number of voltages including lower voltage potential 150, a voltage 179 that is one IR drop above lower voltage potential 150, and a voltage 178 that is two IR drops above lower voltage potential 150. Multiplexer 120c is operable to select one of the aforementioned voltages to pass to comparator 110c for comparison with input conversion voltage 190.

Use of such a resistor ladder to provide the multiplicity of voltage references allows for reasonable calibration and operation of a flash analog to digital converter. However, implementing the resistor ladder requires considerable die area, and operation of the resistor ladder results in considerable power dissipation. Hence, for at least the aforementioned reasons, there exists a need in the art for advanced systems, circuits and methods for electronic signal conversion.

BRIEF SUMMARY OF THE INVENTION

The present invention is related to electronic signal conversion, and more particularly to analog to digital converters.

Various embodiments of the present invention provide analog to digital converter circuits that are capable of converting an input voltage to a digital representation thereof. Such analog to digital converter circuits include at least a first comparator and a second comparator. An input of the first comparator is electrically coupled to a first storage device, and another input of the first comparator is electrically coupled to the input voltage. An input of the second comparator is electrically coupled to a second storage device, and another input of the second comparator is electrically coupled to the input voltage. The analog to digital converter circuits further include a reference voltage generation circuit that provides a first reference voltage to the first storage device, and subsequently provides a second reference voltage to the second storage device.

In particular instances of the aforementioned embodiments, the first storage device is a first capacitor and the second storage device is a second capacitor. In particular cases, sequencing the first reference voltage to the first storage device and the second reference voltage to the second storage device includes applying the first reference voltage to the first storage device during a first time period and applying the second reference voltage to the second storage device during a second time period. In particular cases, the first time period is mutually exclusive of the second time period (i.e., the first time period does not overlap the second time period).

In particular instances of the aforementioned embodiments, the reference voltage generation circuit includes a digital to analog converter and a sequencer circuit. The sequencer circuit causes a first digital value corresponding to the first reference voltage to be applied to the digital to analog converter during the first time period, and causes a second digital value corresponding to the second reference voltage to be applied to the digital to analog converter during the second time period. In various cases, access to the first storage device is controlled by a first switch, and access to the second storage device is controlled by a second switch. In such cases, the sequencer circuit closes the first switch during the first time period, and closes the second switch during the second time period. In particular instances of the aforementioned embodiments, the analog to digital converter circuits further include a calibration control circuit that provides the first digital value, receives an output from the first comparator, and determines whether the first digital value is correct based on the output from the first comparator. Where it is determined that the first digital value is not correct, the calibration control circuit modifies the first digital value, receives the output from the first comparator, and determines whether the modified first digital value is correct. Further, the calibration control circuit provides the second digital value, and receives an output from the second comparator and determines whether the second digital value is correct based on the output from the second comparator. The same process of modification may also be applied to the second digital value.

Other embodiments of the present invention provide methods for performing analog to digital conversion. Such methods include providing an analog to digital converter circuit that includes at least a first comparator and a second comparator. One input of the first comparator receives an input voltage and another input of the first comparator receives a first reference voltage. One input of the second comparator receives the input voltage and another input of the second comparator receives a second reference voltage. The analog to digital converter further includes a first storage device that is electrically coupled to the first reference voltage, and a second storage device that is electrically coupled to the second reference voltage. The methods further include electrically coupling the input voltage to the first comparator and the second comparator during a first time period and a second time period, electrically coupling the first reference voltage to the first comparator and the first storage device during the first time period, and electrically coupling the second reference voltage to the second comparator and the second storage device during the second time period.

In some instances of the aforementioned embodiments, the analog to digital converter further includes a digital to analog converter. In such instances, the methods further include applying a first digital value to the digital to analog converter during the first time period such that an output of the digital to analog converter is the first reference voltage; and applying a second digital value to the digital to analog converter during the second time period such that the output of the digital to analog converter is the second reference voltage. In various instances of the aforementioned embodiments, the methods further include receiving an output of the first comparator; modifying the first digital value based at least in part on the output of the first comparator; applying the modified first digital value to the digital to analog converter during a subsequent first time period; receiving an output of the second comparator; modifying the second digital value based at least in part on the output of the second comparator; and applying the modified second digital value to the digital to analog converter during a subsequent second time period.

Yet other embodiments of the present invention provide electronic systems. Such electronic systems include an analog to digital converter circuit. The analog to digital converter circuit includes a first and a second comparator, a first and a second switch, and a first and a second storage device. One input of the first comparator is electrically coupled to the first storage device and to the first switch, and another input of the first comparator is electrically coupled to an input voltage. One input of the second comparator is electrically coupled to the second storage device and to the second switch, and another input of the second comparator is electrically coupled to the input voltage. The electronic systems further include a reference source that is electrically coupled to the first switch and to the second switch. The reference source provides the first reference voltage during a first time period and the second reference voltage during a second time period. The electronic systems further include a sequencer circuit that is operable to close the first switch during the first time period and to close the second switch during the second time period. The electronic system may be, but is not limited to, a cellular telephone, a computer, and a hard disk drive.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to electronic signal conversion, and more particularly to analog to digital converters.

Figure 1:
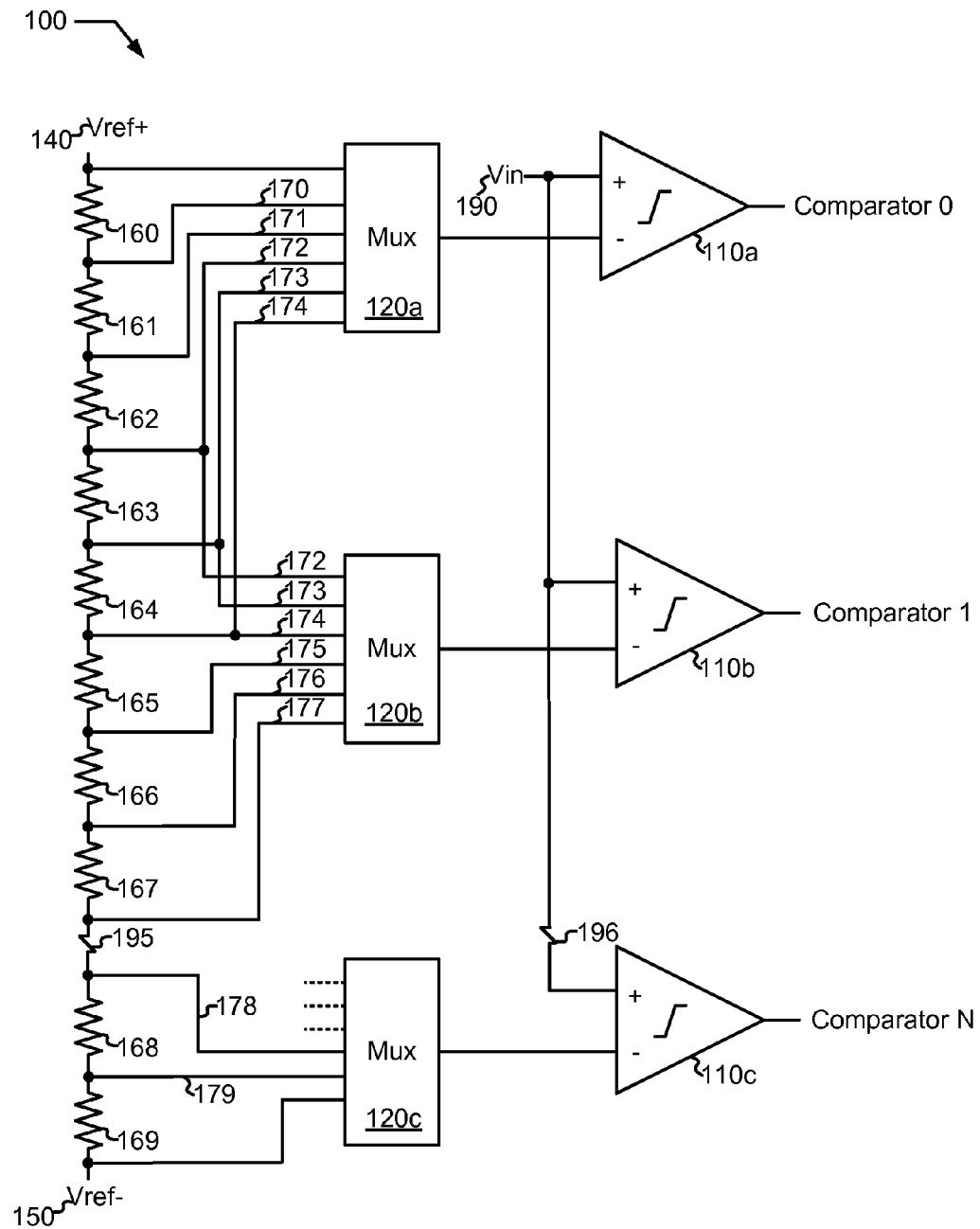
FIG. 1 is a prior art analog to digital converter including a resistor ladder.
Figure 2:
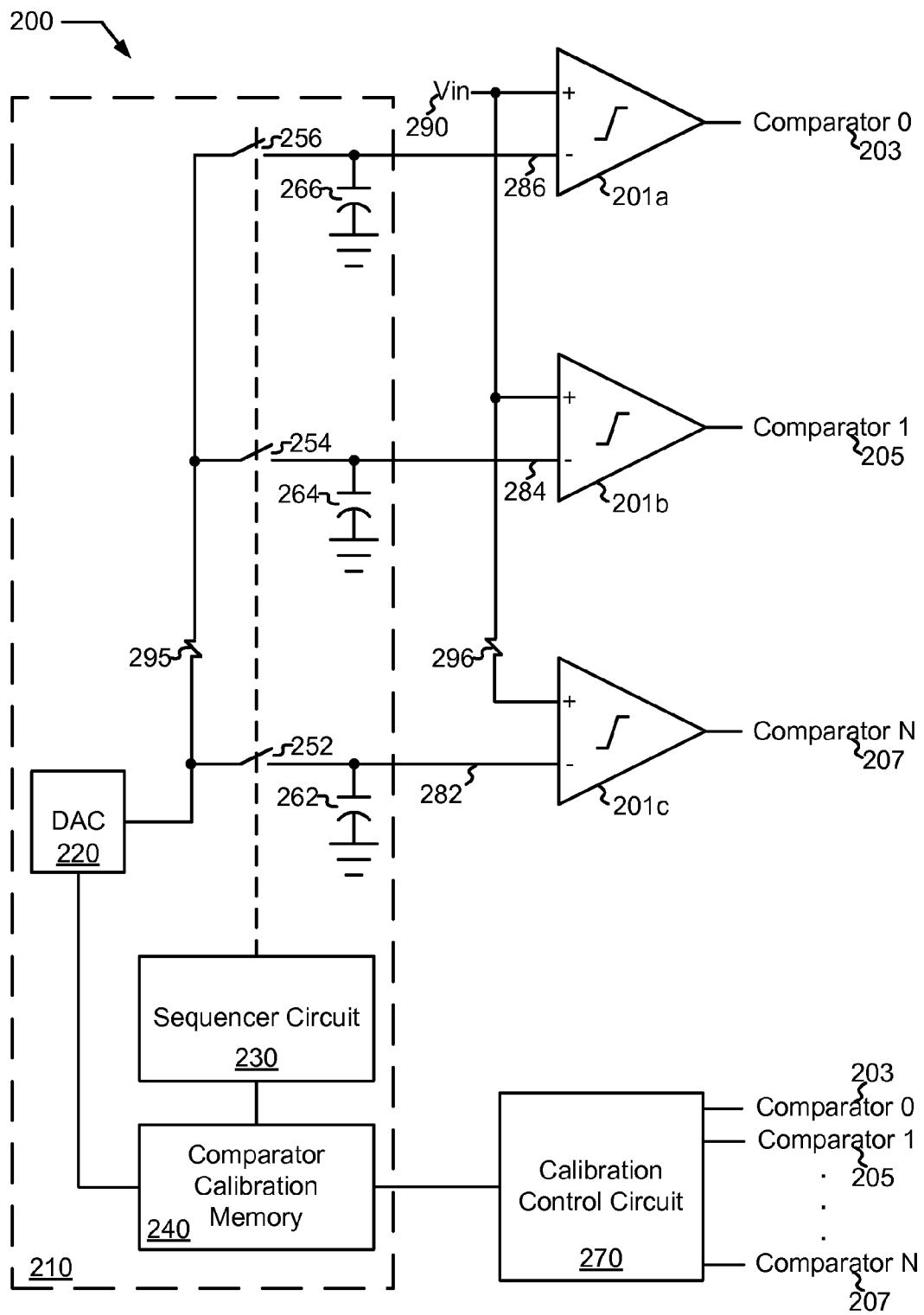
FIG. 2 shows an analog to digital converter with a dynamic reference generation system in accordance with one or more embodiments of the present invention.

Turning to FIG. 2, an analog to digital converter 200 with a dynamic reference generation system 210 is depicted in accordance with one or more embodiments of the present invention. Analog to digital converter 200 includes a number of comparators 201 that each have one input electrically coupled to an input voltage 290 that is to be converted to a digital representation thereof. Comparator 201a provides a comparator output 203 (i.e., comparator output 0), comparator 201b provides a comparator output 205 (i.e., comparator output 1), and comparator 201c provides a comparator output 207 (i.e., comparator output N). While three comparators 201 and associated circuitry are depicted, more than this number may be included in analog to digital converter 200 as indicated by marks 295, 296. The number of comparators and associated circuitry may be chosen based on a desired resolution of analog to digital converter 200. The other input of each of comparators 201 is driven by a reference voltage received from dynamic reference generation system 210. In particular, the other input of comparator 201a receives a reference voltage 286, the other input of comparator 201b receives a reference voltage 284, and the other input of comparator 201c receives a reference voltage 282.

Dynamic reference generation system 210 includes a digital to analog converter 220 that provides an analog voltage output to a capacitor 266 via a switch 256, to a capacitor 264 via a switch 254, and to a capacitor 262 via a switch 252. Dynamic reference generation system 210 includes a sequencer circuit 230 that controls a sequence of digital values applied to digital to analog converter 220 and the closing and opening of switches 256, 254, 252. In some embodiments, the sequence of digital values applied to digital to analog converter 220 are provided from a comparator calibration memory 240. In one particular embodiment of the present invention, comparator calibration memory 240 includes a memory location for each of comparators 201. Each of the memory locations holds a digital value that when applied to digital to analog converter 220 will result in a desired reference voltage output for the respective comparator. Analog to digital converter 200 further includes a calibration control circuit 270. Calibration control circuit 270 is capable of providing digital values to digital to analog converter 220, and in turn receiving the outputs from comparators 201.

During calibration, a predetermined voltage potential is applied as input voltage 290. Application of such a predetermined voltage may be generated in any number of ways. For example, the predetermined voltage may be generated using a digital to analog converter. Based on the disclosure provided herein, one of ordinary skill in the art will appreciate other ways by which such a predetermined voltage may be generated. The predetermined voltage potential is initially set to equal the desired switching level of comparator 201a. In addition, sequencer circuit 230 closes switch 256 and repeatedly causes the digital value corresponding to the threshold of comparator 201a to be applied from comparator calibration memory 240 to digital to analog converter 220. Calibration control circuit 270 updates the digital value corresponding to the threshold of comparator 201a in comparator calibration memory 240 until the desired result of comparator output 203 is achieved for the given input voltage. In one particular case, this may be achieved by incrementing the digital value corresponding to the threshold of comparator 201a until comparator output 203 switches. The aforementioned process is repeated for each of comparators 201 by applying a voltage potential to input voltage 290 that is tailored for the particular comparator 201. Once this process is completed for all of comparators 201, a digital value corresponding to the thresholds of each of comparators 201 is stored in comparator calibration memory 240 and analog to digital converter 200 is considered calibrated. These digital values are used during normal operation to provide reference voltages to each of comparators 201 for an analog to digital conversion is ongoing. In some cases, the time that expires during the calibration period assures that each of capacitors 262, 264, 266 are charged to a voltage potential very close to the desired reference voltage. The calibration process may occur periodically based on a timer, or may occur each time a reset or power on condition occurs. Based on the disclosure provided herein, one of ordinary skill in the art will recognize appropriate times to allow the calibration process to complete.

In normal operation, sequencer circuit 230 cycles through the digital values maintained in comparator calibration memory 240, and a delay period later controls the opening and closing of switches 252, 254, 256. In particular, sequencer circuit 230 applies an address to comparator calibration memory 240, and based on the provided address comparator calibration memory 240 provides a digital value that corresponds to the threshold of comparator 201a. After digital to analog converter 220 settles, switch 256 is closed. The digital value is applied to digital to analog converter 220 that generates reference voltage 286 for comparator 201a. Reference voltage 286 is applied to capacitor 266 that is charged and substantially maintains the voltage potential during a later period when switch 256 is opened. Subsequently, sequencer circuit 230 opens switch 256.

Then, sequencer circuit 240 applies an address to comparator calibration memory 240, and based on the provided address comparator calibration memory 240 provides a digital value that corresponds to the threshold of comparator 201b. After digital to analog converter 220 settles, switch 254 is closed. The digital value is applied to digital to analog converter 220 that generates reference voltage 284 for comparator 201b. Reference voltage 284 is applied to capacitor 264 that is charged and substantially maintains the voltage potential during a later period when switch 254 is opened. Subsequently, sequencer circuit 230 opens switch 254.

Then, sequencer circuit 230 applies an address to comparator calibration memory 240, and based on the provided address comparator calibration memory 240 provides a digital value that corresponds to the threshold of comparator 201c. After digital to analog converter 220 settles, switch 252 is closed. The digital value is applied to digital to analog converter 220 that generates reference voltage 282 for comparator 201c. Reference voltage 282 is applied to capacitor 262 that is charged and substantially maintains the voltage potential during a later period when switch 252 is opened. Subsequently, sequencer circuit 230 opens switch 252.

Once all of capacitors 262, 264, 266 are charged, the sequence is repeated to replace any charge on the respective capacitors that is lost during operation. As one of various advantages of the aforementioned embodiment, a relatively small dynamic reference voltage system may be used to replace prior art resistor ladders. Further, in some cases, such a dynamic reference voltage system may use less power than that of its prior art counter parts. Based on the disclosure provided herein, one of ordinary skill in the art will recognize a variety of other advantages that may be achieved in accordance with different embodiments of the present invention.

The time that a reference voltage is applied to a given capacitor before charging of a subsequent capacitor begins may be sufficiently large to allow the capacitor to fully charge. The time may be restricted such that discharge occurring on any capacitor between charges is insignificant. In some cases, where a large number of comparators and reference voltages are utilized, the period between charging of a given capacitor may become sufficiently long as to result in a substantial decrease in the reference voltage applied to the particular comparator. This results in of spurious operation of analog to digital converter 200. To alleviate this, one or more additional analog to digital converters may be used to distribute the charging responsibilities. As an example, the time between charges on a given capacitor may be reduced in half where two digital to analog converters are used.

Figure 3:
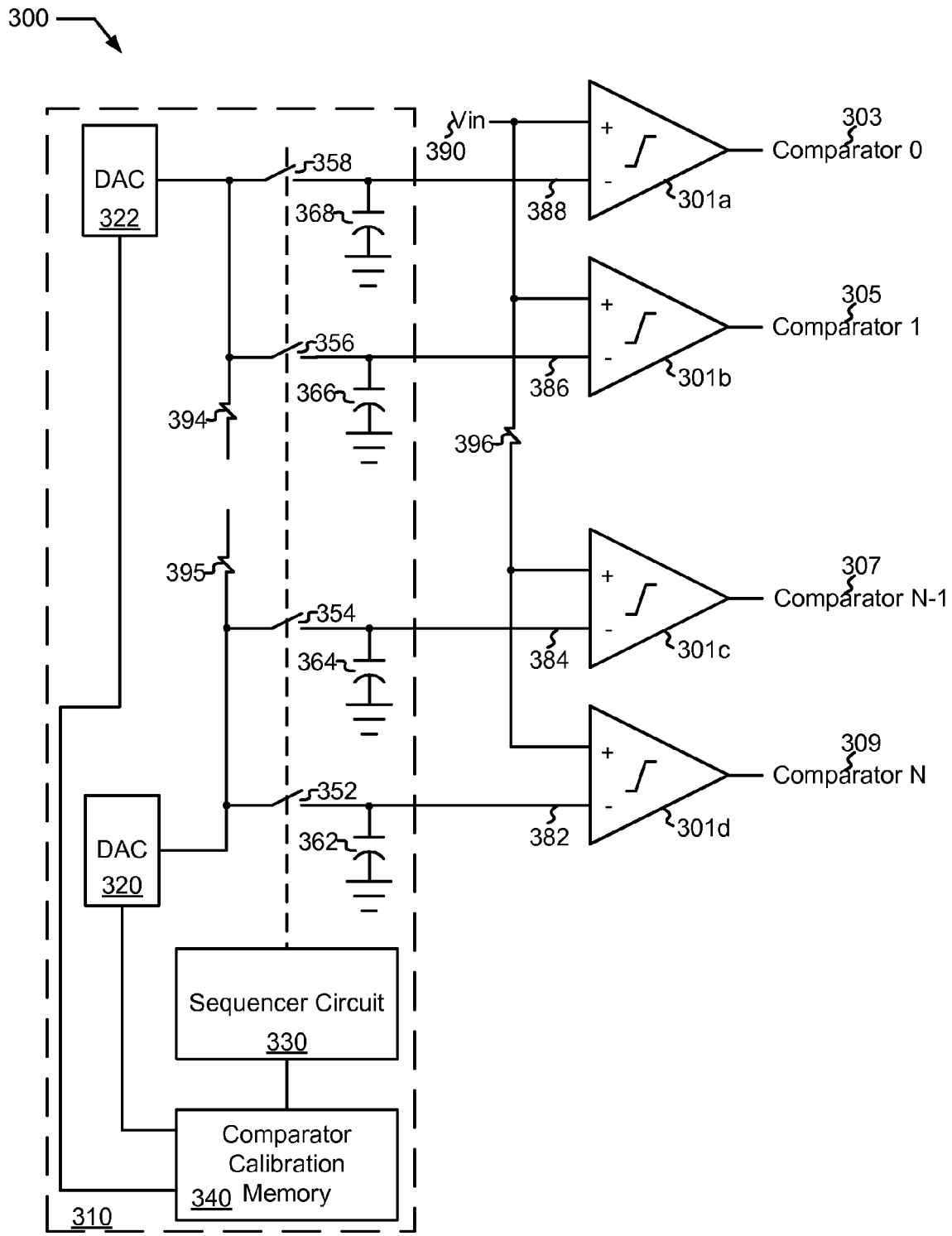
FIG. 3 depicts an analog to digital converter with multiple digital to analog converters in accordance with some embodiments of the present invention.

Turning to FIG. 3, an analog to digital converter 300 with multiple digital to analog converters 320, 322 is shown in accordance with some embodiments of the present invention. Analog to digital converter 300 includes a number of comparators 301 that each have one input electrically coupled to an input voltage 390 that is to be converted to a digital representation thereof. Comparator 301a provides a comparator output 303 (i.e., comparator output 0), comparator 301b provides a comparator output 305 (i.e., comparator output 1), comparator 301c provides a comparator output 307 (i.e., comparator output N−1), and comparator 301d provides a comparator output 309 (i.e., comparator output N). While four comparators 301 and associated circuitry are depicted, more than this number may be included in analog to digital converter 300 as indicated by marks 394, 395, 396. The number of comparators and associated circuitry that may be used may be chosen based on a desired resolution of analog to digital converter 300. The other input of each of comparators 301 is driven by a reference voltage received from a dynamic reference generation system 310. In particular, the other input of comparator 301a receives a reference voltage 388, the other input of comparator 301b receives a reference voltage 386, the other input of comparator 301c receives a reference voltage 384, and the other input of comparator 301d receives a reference voltage 382.

Dynamic reference generation system 310 includes two digital to analog converters 320, 322. Digital to analog converter 322 provides an analog voltage output to a capacitor 368 via a switch 358, and to a capacitor 366 via a switch 356. Digital to analog converter 320 provides an analog voltage output to a capacitor 364 via a switch 354, and to a capacitor 362 via a switch 352. Dynamic reference generation system 310 includes a sequencer circuit 330 that controls a sequence of digital values applied to digital to analog converters 320, 322 and the closing and opening of switches 358, 356, 354, 352. In some embodiments, the sequence of digital values applied to digital to analog converters 320, 322 are provided from a comparator calibration memory 340. In one particular embodiment of the present invention, comparator calibration memory 340 includes a memory location for each of comparators 301. Each of the memory locations holds a digital value that when applied to a respective one of digital to analog converters 320, 322 will result in a desired reference voltage output for the respective comparator.

In normal operation, sequencer circuit 330 cycles through the digital values maintained in comparator calibration memory 340, and a delay period later controls the opening and closing of switches 352, 354, 356, 358. In particular, sequencer circuit 330 applies an address to comparator calibration memory 340 that corresponds to the digital values associated with comparator 301a and comparator 301c, and a delay period later closes switch 358 and switch 354. The digital value corresponding to the threshold of comparator 301a is applied to digital to analog converter 322, and the digital value corresponding to the threshold of comparator 301c is applied to digital to analog converter 320. Digital to analog converter 322 generates reference voltage 388 for comparator 301a, and digital to analog converter 320 generates reference voltage 384 for comparator 301c. Reference voltage 388 is applied to capacitor 368 that is charged and substantially maintains the voltage potential during a later period when switch 358 is opened. Similarly, reference voltage 384 is applied to capacitor 364 that is charged and substantially maintains the voltage potential during a later period when switch 354 is opened.

Then, sequencer circuit 330 that corresponds to the digital values associated with comparator 301b and comparator 301d, and a delay period later closes switch 356 and switch 352. The digital value corresponding to the threshold of comparator 301b is applied to digital to analog converter 322, and the digital value corresponding to the threshold of comparator 301d is applied to digital to analog converter 320. Digital to analog converter 322 generates reference voltage 386 for comparator 301b, and digital to analog converter 320 generates reference voltage 382 for comparator 301d. Reference voltage 386 is applied to capacitor 366 that is charged and substantially maintains the voltage potential during a later period when switch 356 is opened. Similarly, reference voltage 382 is applied to capacitor 362 that is charged and substantially maintains the voltage potential during a later period when switch 352 is opened. Once all of capacitors 362, 364, 366, 368 are charged, the process is repeated to replace any charge on the respective capacitors that is lost during operation.

Figure 4:
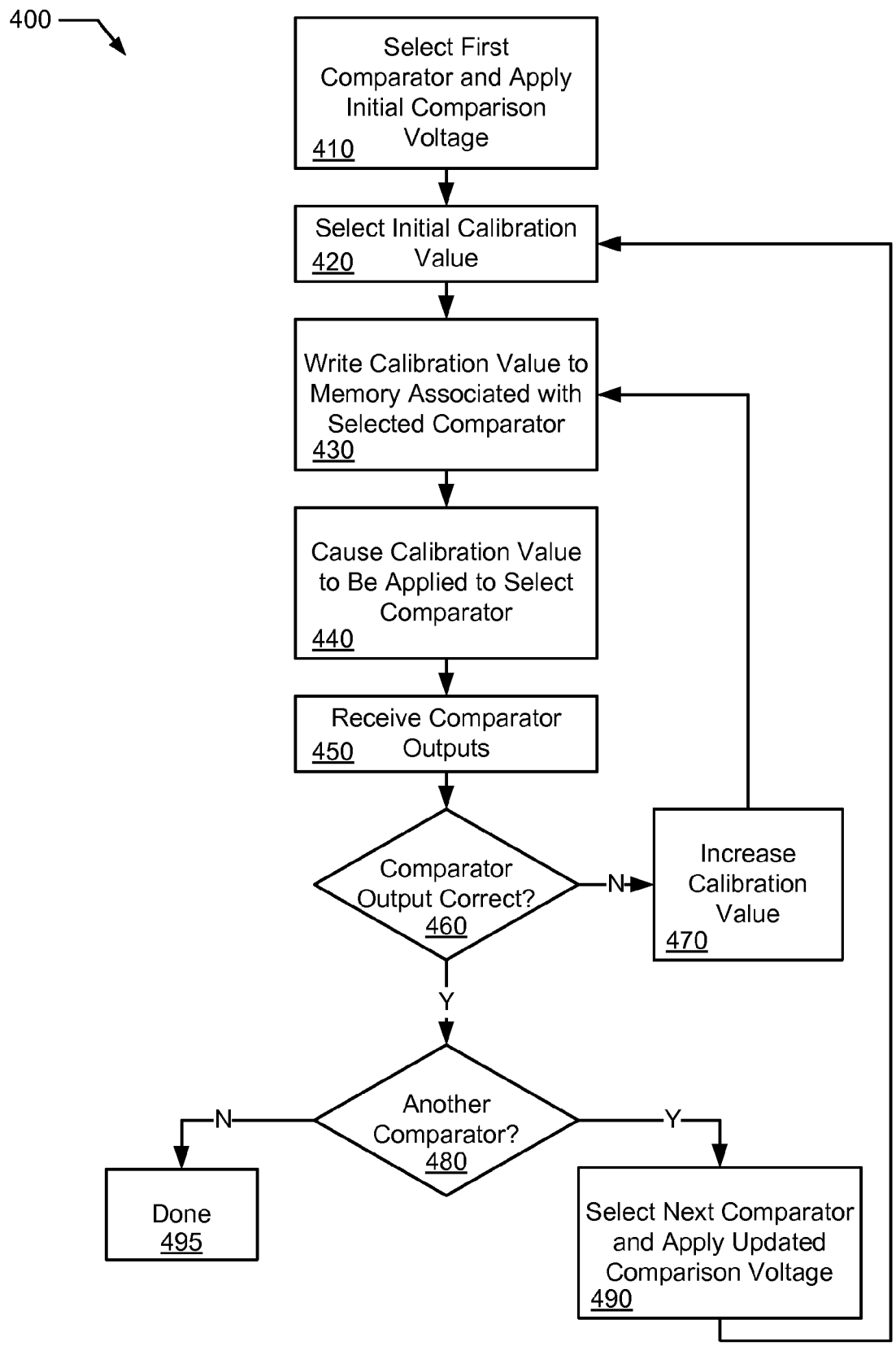
FIG. 4 is a flow diagram depicting a method in accordance with some embodiments of the present invention for calibrating an analog to digital converter.

Turning to FIG. 4, a flow diagram 400 depicts a method in accordance with some embodiments of the present invention for calibrating an analog to digital converter. Following flow diagram 400, a first comparator in an analog to digital converter is selected, and a comparison voltage associated with the selected comparator is applied to the voltage input of the analog to digital converter (block 410). An initial calibration value is selected (block 420), and written to a memory location associated with the selected comparator (block 430). An analog voltage corresponding to the calibration value is then applied to the selected comparator (block 440), and the resulting output from the selected comparator is received (block 450). It is determined whether the received comparator output is the desired or expected output based on the applied voltage input (block 460). Where it is not the desired or expected output (block 460), the calibration value is increased (block 470), and the processes of blocks 430-460 are repeated for the new calibration value. Based on the disclosure provided herein, one of ordinary skill in the art will recognize other calibration approaches and schemes that may be used in accordance with different embodiments of the present invention. For example, a binary search approach may be used where the initial value is chosen to be a mid range value with the binary search continuing from that point. Such a binary search scheme may be used in place of the disclosed linear search scheme of FIG. 4.

Alternatively, where the output of the comparator is the expected or desired value (block 460), it is determined whether another comparator is to be calibrated (block 480). Where another comparator is to be calibrated (block 480), the next comparator in the analog to digital converter is selected, and a comparison voltage associated with the selected comparator is applied to the voltage input of the analog to digital converter (block 490). With the next comparator selected (block 490), the processes of blocks 420-490 are repeated for the selected comparator. Once all of the comparators have been calibrated (block 480), the calibration process is complete (block 495). Once the calibration process is complete, the memory will include a calibration value for each of the comparators in the analog to digital converter.

Figure 5:
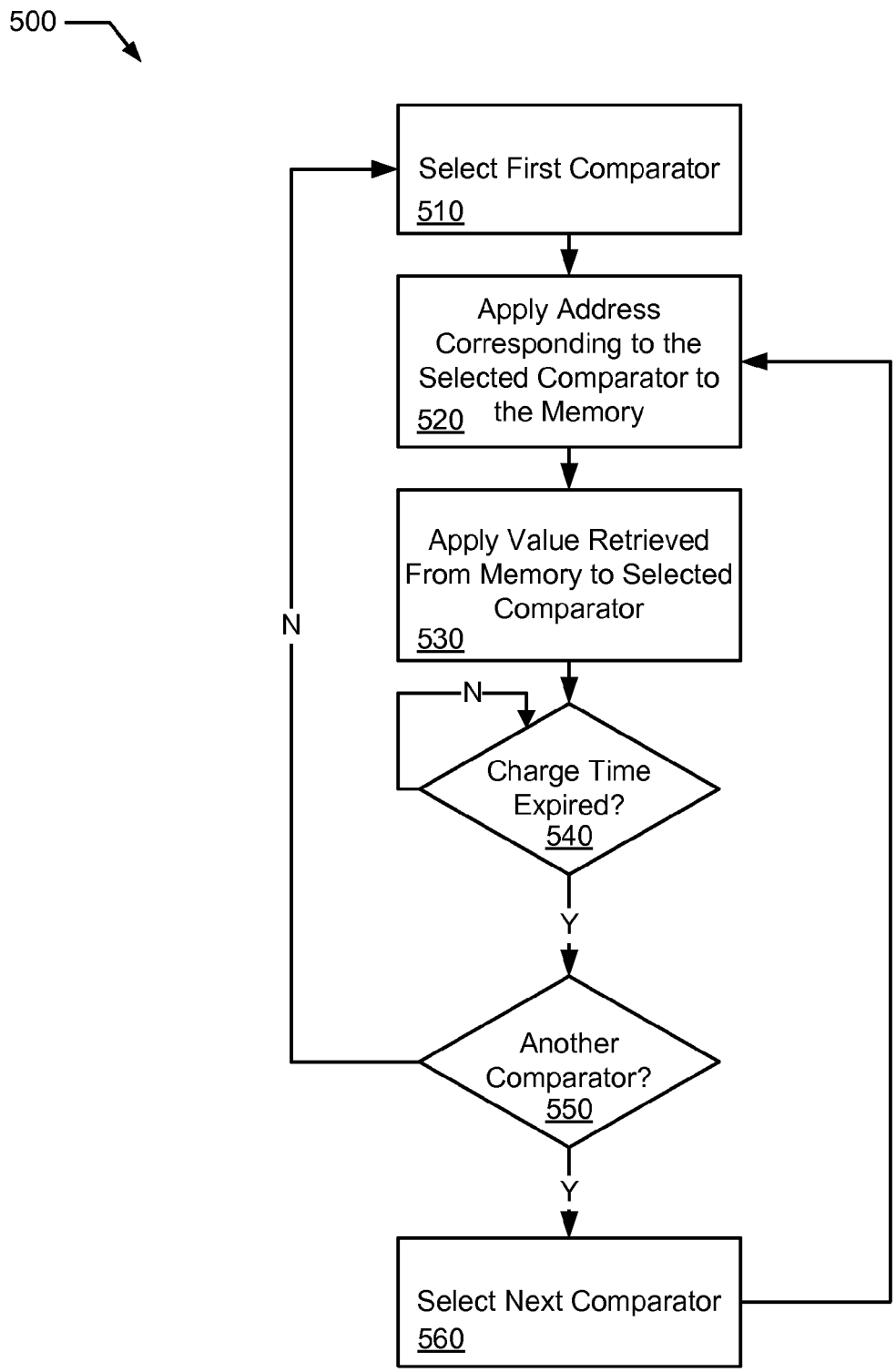
FIG. 5 is a flow diagram showing a method in accordance with various embodiments of the present invention for performing analog to digital conversion.

Turning to FIG. 5, a flow diagram 500 shows a method in accordance with various embodiments of the present invention for performing analog to digital conversion. Following flow diagram 500, a first comparator in an analog to digital converter is selected (block 510). An address corresponding to the selected comparator is applied to a memory including calibration values (block 520). This results in a calibration value being applied to a digital to analog converter, and a corresponding analog reference voltage being applied to the selected comparator (block 530). It is then determined whether the reference voltage has been applied to the selected comparator for a sufficient period of time (block 540). A sufficient period of time may be, for example, a time period sufficient to fully charge a capacitor coupled to the selected comparator. Based on the disclosure provided herein, one of ordinary skill in the art will recognize a measurement of time that may be chosen for a particular analog to digital converter design. Where the expired time is insufficient (block 540), the process stalls. Alternatively, where a sufficient period of time has passed (block 540), it is determined whether another comparator remains in the analog to digital converter (block 550). Where another comparator exists (block 560), the next comparator is selected (block 560), and the process of blocks 520-550 are performed for the next selected comparator. Alternatively, where another comparator does not exist (block 560), the first comparator is again selected (block 510), and the processes of blocks 520-560 are repeated.

In conclusion, the invention provides novel systems, circuits, methods and arrangements for converting an analog signal to a digital signal. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An analog to digital converter circuit, the analog to digital converter circuit comprising:
a first comparator, wherein the first comparator receives an input voltage and a first reference voltage;
a first storage device, wherein the first storage device is electrically coupled to the first reference voltage;
a second comparator, wherein the second comparator receives the input voltage and a second reference voltage;
a second storage device, wherein the second storage device is electrically coupled to the second reference voltage; and a reference voltage generation circuit, wherein the reference voltage generation circuit provides the first reference voltage and the second reference voltage, wherein the first reference voltage is provided during a first time period and the second reference voltage is provided during a second time period, and wherein the reference voltage generation circuit includes:
a digital to analog converter and a sequencer circuit, wherein the sequencer circuit causes a first digital value corresponding to the first reference voltage to be applied to the digital to analog converter during the first time period, and wherein the sequencer circuit causes a second digital value corresponding to the second reference voltage to be applied to the digital to analog converter during the second time period.

2. The analog to digital converter circuit of claim 1, wherein the first storage device is a capacitor.

3. The analog to digital converter circuit of claim 1, wherein the first time period is mutually exclusive of the second time period.

4. The analog to digital converter circuit of claim 1, wherein access to the first storage device is controlled by a first switch, and wherein access to the second storage device is controlled by a second switch.

5. The analog to digital converter circuit of claim 4, wherein the sequencer circuit closes the first switch during the first time period, and wherein the sequencer circuit closes the second switch during the second time period.

6. The analog to digital converter circuit of claim 1, wherein the analog to digital converter circuit further comprises:
a calibration control circuit, wherein the calibration control circuit provides the first digital value, and wherein the calibration control circuit receives an output from the first comparator and determines whether the first digital value is correct.

7. The analog to digital converter circuit of claim 6, wherein upon determining that the first digital value is not correct, the calibration control circuit modifies the first digital value, and wherein the calibration control circuit receives the output from the first comparator and determines whether the modified first digital value is correct.

8. The analog to digital converter circuit of claim 6, wherein the calibration control circuit provides the second digital value, and wherein the calibration control circuit receives an output from the second comparator and determines whether the second digital value is correct.

9. The analog to digital converter circuit of claim 6, wherein access to the first storage device is controlled by a first switch, wherein access to the second storage device is controlled by a second switch, wherein the sequencer circuit closes the first switch during the first time period, and wherein the sequencer circuit closes the second switch during the second time period.

10. The analog to digital converter circuit of claim 9, wherein the first time period is mutually exclusive of the second time period.

11. A method for performing analog to digital conversion, the method comprising:
providing an analog to digital converter circuit, wherein the analog to digital converter circuit includes:
a first comparator, wherein the first comparator receives an input voltage and a first reference voltage;
a first storage device, wherein the first storage device is electrically coupled to the first reference voltage;
a second comparator, wherein the second comparator receives the input voltage and a second reference voltage;
a second storage device, wherein the second storage device is electrically coupled to the second reference voltage;
a digital to analog converter; and
electrically coupling the input voltage to the first comparator and the second comparator during a first time period and a second time period;
electrically coupling the first reference voltage to the first comparator and the first storage device during the first time period; and
electrically coupling the second reference voltage to the second comparator and the second storage device during the second time period;
applying a first digital value to the digital to analog converter during the first time period, wherein an output of the digital to analog converter is the first reference voltage.

12. The method of claim 11, wherein the first time period is mutually exclusive of the second time period.

13. The method of claim 11, wherein the method further comprises:
applying a second digital value to the digital to analog converter during the second time period, wherein the output of the digital to analog converter is the second reference voltage.

14. The method of claim 13, wherein the method further comprises:
receiving an output of the first comparator;
modifying the first digital value based at least in part on the output of the first comparator; and
applying the modified first digital value to the digital to analog converter during a subsequent first time period.

15. The method of claim 14, wherein the method further comprises:
receiving an output of the second comparator;
modifying the second digital value based at least in part on the output of the second comparator; and
applying the modified second digital value to the digital to analog converter during a subsequent second time period.

16. An electronic system, the electronic system comprising:
an analog to digital converter circuit including:
a first comparator, a first switch, and a first storage device; wherein one input of the first comparator is electrically coupled to the first storage device and to the first switch; and wherein another input of the first comparator is electrically coupled to an input voltage;
a second comparator, a second switch, and a second storage device;
wherein one input of the second comparator is electrically coupled to the second storage device and to the second switch; and wherein another input of the second comparator is electrically coupled to the input voltage;
a digital to analog converter, wherein the digital to analog converter is electrically coupled to the first switch and to the second switch, and wherein the digital to analog converter provides the first reference voltage during a first time period and the second reference voltage during a second time period; and
a sequencer circuit, wherein the sequencer circuit is operable to close the first switch during the first time period and to close the second switch during the second time period.

17. The electronic system of claim 16, wherein the sequencer circuit is further operable to provide a first digital value corresponding to the first reference voltage to the digital to analog converter during the first time period, and wherein the sequencer circuit, and to provide a second digital value corresponding to the second reference voltage to the digital to analog converter during the second time period.

18. The electronic system of claim 16, wherein the electronic system is selected from a group consisting of: a cellular telephone, a computer, and a hard disk drive.

19. The electronic system of claim 16, wherein the first storage device is a first capacitor and the second storage device is a second capacitor.

20. An analog to digital converter circuit, the analog to digital converter circuit comprising:
- a first comparator and a first storage device, wherein the first comparator receives a time varying input voltage at a first input and a first reference voltage at a second input, and wherein the first storage device is electrically coupled to the first reference voltage;
- a second comparator and a second storage device, wherein the second comparator receives the time varying input voltage at a third input and a second reference voltage at the fourth input, and wherein the second storage device is electrically coupled to the second reference voltage;
- a reference voltage generation circuit, wherein the reference voltage generation circuit provides the first reference voltage at a first time period and the second reference voltage at a second time period, and wherein the reference voltage generation circuit includes:
  - a digital to analog converter, wherein the digital to analog converter receives a first digital value, wherein the digital to analog converter converts the first digital value to the first reference voltage during the first time period, wherein the digital to analog converter receives a second digital value, wherein the digital to analog converter converts the second digital value to the second reference voltage during the second time period.

21. The analog to digital converter circuit of claim 20, wherein the reference voltage generation circuit further comprises a sequencer circuit, wherein access to the first storage device is controlled by a first switch, wherein access to the second storage device is controlled by a second switch, and wherein the sequencer circuit closes the first switch during the first time period and closes the second switch during the second time period.

22. The analog to digital converter circuit of claim 20, wherein the analog to digital converter circuit further comprises:
- a calibration control circuit, wherein the calibration control circuit provides the first digital value, wherein the calibration control circuit receives an output from the first comparator and determines whether the first digital value is correct, wherein the calibration control circuit provides the second digital value, and wherein the calibration control circuit receives an output from the second comparator and determines whether the second digital value is correct.

23. The analog to digital converter circuit of claim 22, wherein upon determining that the first digital value is not correct, the calibration control circuit modifies the first digital value, and wherein the calibration control circuit receives the output from the first comparator and determines whether the modified first digital value is correct.

* * * * *